United States Patent
Benisty et al.

(10) Patent No.: US 10,838,636 B2
(45) Date of Patent: Nov. 17, 2020

(54) HIERARCHICAL CLOCK SCALING IN A DATA STORAGE CONTROLLER

(71) Applicant: Western Digital Technologies, Inc., San Jose, CA (US)

(72) Inventors: Shay Benisty, Beer Sheva (IL); Tal Sharifie, Lehavim (IL); Leonid Minz, Beer Sheva (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 144 days.

(21) Appl. No.: 15/984,253

(22) Filed: May 18, 2018

(65) Prior Publication Data

US 2019/0354300 A1 Nov. 21, 2019

(51) Int. Cl.
*G06F 3/06* (2006.01)
(52) U.S. Cl.
CPC .......... *G06F 3/0634* (2013.01); *G06F 3/0604* (2013.01); *G06F 3/0679* (2013.01)
(58) Field of Classification Search
CPC .... G06F 3/0634; G06F 3/0604; G06F 3/0679; G06F 1/06; G06F 1/08; G06F 1/10
USPC .................................................. 713/300–501
See application file for complete search history.

(56) References Cited

U.S. PATENT DOCUMENTS

| | | | | |
|---|---|---|---|---|
| 6,844,767 B2* | 1/2005 | Shelor | ....................... | G06F 1/10 327/291 |
| 6,915,438 B2* | 7/2005 | Boros | ................... | G06F 1/3203 713/322 |
| 8,839,006 B2* | 9/2014 | Li | ......................... | G06F 1/3228 713/300 |
| 9,152,214 B2* | 10/2015 | Thumma | ................. | G06F 1/324 |
| 9,467,150 B2* | 10/2016 | Tidwell | ................... | G06F 1/324 |
| 9,996,398 B2* | 6/2018 | Lee | ....................... | G06F 9/4893 |
| 10,133,336 B2* | 11/2018 | Wang | .................... | G06F 1/3287 |
| 10,187,045 B2* | 1/2019 | Zyuban | .................... | H03K 5/05 |
| 10,203,740 B2* | 2/2019 | Segawa | ................. | G06F 1/3296 |
| 10,496,572 B1* | 12/2019 | Kelm | ...................... | G06F 13/24 |
| 2006/0177064 A1 | 8/2006 | Holtzman et al. | | |

(Continued)

OTHER PUBLICATIONS

NVM Express; "Non-Volatile Memory Express" Revision 1.3a, dated Oct. 24, 2017; 287 pages.

(Continued)

*Primary Examiner* — Brian T Misiura
(74) *Attorney, Agent, or Firm* — Loza & Loza, LLP; Gabriel Fitch

(57) ABSTRACT

The present disclosure describes technologies and techniques for use by a data storage controller—such as a non-volatile memory (NVM) controller—to adaptively and hierarchically scale clock signals distributed to its internal components. In various examples described herein, the data storage controller is configured to downscale the internal clocks of the controller for all processing sub-blocks that are in an Active Idle state (or in similar idle states where a component is active but has no tasks to perform). When an entire hierarchy of components is idle, the clock signal applied to the entire hierarchy is downscaled. By downscaling the clock for an entire hierarchy of components, power consumed by the corresponding clock tree is also reduced. In specific examples, clock signals are downscaled by a factor of thirty-two to reduce power consumption. NVMe examples are provided herein.

24 Claims, 15 Drawing Sheets

(56) References Cited

U.S. PATENT DOCUMENTS

2017/0344049 A1* 11/2017 Koppen ................... G06F 1/06
2019/0250930 A1* 8/2019 Erez ...................... G06F 1/3296

* cited by examiner

HIERARCHICAL CLOCK SCALING IN A DATA STORAGE CONTROLLER

FIELD

The subject matter described herein relates to data storage devices and controllers. More particularly, the subject matter relates, in some examples, to the control and distribution of clock signals within a data storage controller of a non-volatile memory (NVM) system.

INTRODUCTION

Solid state data (SSD) storage devices incorporating non-volatile memories (NVMs), such as flash NAND-based memories, are replacing or supplementing conventional rotating hard disk drives for mass storage in many consumer electronic devices and computers. In NAND-based products, a data storage controller of the SSD responds to commands received from a host device such as laptop computer by reading/writing data to/from a NAND storage element (herein-after "NAND").

Power management can be a significant issue within SSDs since the devices are often integrated within laptop computers configured to consume low power to preserve battery life. Within some SSDs, an important power parameter is the "Active Idle" power consumption. Active Idle refers to a processing state where the SSD is in a full power state but it is idle, i.e. there are no pending tasks in the controller of the SSD. Active Idle can consume considerable power since the device is in a full power state even though it is not performing any tasks.

It would be desirable to provide solutions for reducing power consumption during idle states (such as Active Idle or other non-busy or non-active states or conditions) or for addressing other power consumption issues in SSDs or similar devices.

SUMMARY

One embodiment of the present disclosure provides a method for use by a data storage controller comprising a set of processing components comprising one or more sub-components, the method including: generating a system clock; distributing versions of the system clock to the set of processing components and their sub-components; detecting that all of the sub-components of a particular component are in a particular state; and scaling a frequency of the version of the system clock distributed to the particular component and to all of the sub-components of the particular component, in response to the detection that all of the sub-components of the particular component are in the particular state.

Another embodiment of the present disclosure provides a data storage controller, including: a set of processing components comprising one or more sub-components; a system clock generator configured to generate a system clock; clock distribution circuitry configured to distribute versions of the system clock to the set of processing components and their sub-components; detection circuitry configured to detect that all of the sub-components of a particular component are in a particular state; and clock scaling circuitry configured to scale a frequency of the version of the system clock distributed to the particular component and to all of the sub-components of the particular component, the clock scaling circuitry operative in response to a detection that all of the sub-components of a particular component are in the particular state.

Yet another embodiment of the present disclosure provides an apparatus for use with a data storage system comprising a set of processing components comprising one or more sub-components, the apparatus including: means for distributing versions of a system clock to a set of processing components and their sub-components; means for detecting that all of the sub-components of a particular component are in a particular state; and means for scaling a frequency of the version of the system clock distributed to the particular component and to all of the sub-components of the particular component, the means for scaling operative in response to a detection that all of the sub-components of a particular component are in the particular state.

BRIEF DESCRIPTION OF THE DRAWINGS

The subject matter described herein will now be explained with reference to the accompanying drawings of which.

DETAILED DESCRIPTION

Figure 1:
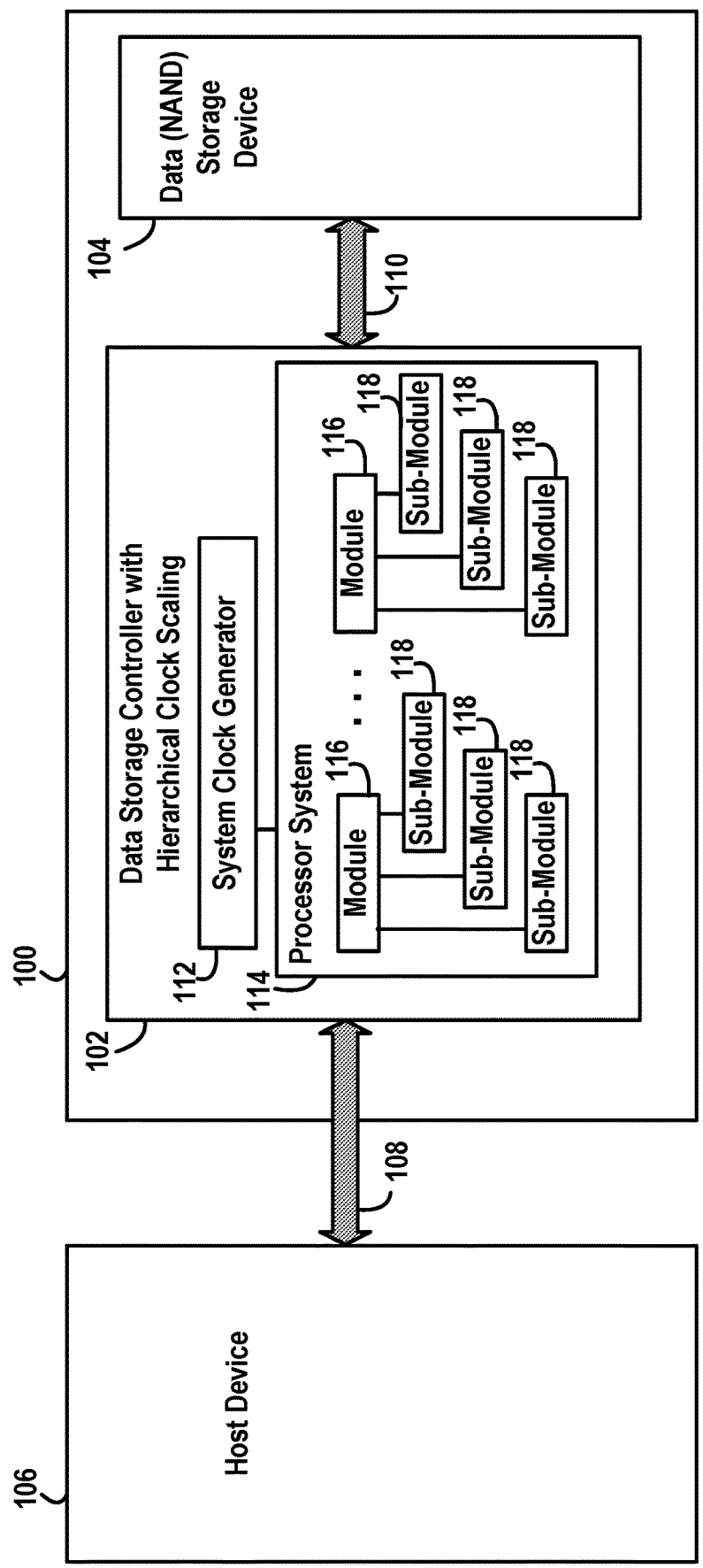
FIG. 1 illustrates a data storage system having a data storage controller and a data storage device (such as a NAND), where the data storage controller is equipped to adaptively and hierarchically scale clock signals distributed to various modules and sub-modules.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Overview

Aspects of the present disclosure provide various apparatus, devices, systems and methods for controlling power usage within solid state drives (SSDs) or other non-volatile memory (NVM) storage systems. Examples herein relate to NVM systems configured for use with the NVM Express (NVMe) system, wherein an NVM data storage controller (i.e. a device controller) is configured to control access to an NVM such as a NAND using NVMe protocols. See, the NVM Express standard, Revision 1.3a, Oct. 24, 2017. However, aspects of the techniques described herein are applicable to other data storage systems or protocols.

As noted in the Introduction Section above, power management can be a significant issue within SSDs, particularly during "Active Idle" where the SSD is in a full power state but there are no pending tasks in the controller of the SSD. One approach to reducing power consumption during idle states is to configure firmware of the data storage controller of the SSD to handle power management during the idle states. In one example, when the firmware detects that the SSD is in an idle state, the firmware gates the various clock signals used by the SSD. By gating a clock signal, it is meant herein that the clock signal is disabled or deactivated, and not merely reduced in frequency. The clock signal may be gated by holding the voltage of the clock signal in a fixed state, e.g., a low voltage state, until the clock signal is needed again. By gating the clock signal applied to a circuit, any flip-flops in the circuit do not switch states, thereby substantially eliminating switching power consumption (with only leakage currents remaining) When detecting any activity, the firmware may reactivate the clock by un-gating the clock signal (and thereby allowing the clock signal to again oscillate between upper and lower voltage states at high frequencies). However, since firmware is involved in the power management process, the latency time for entering and exiting the power reduction state can be quite large and therefor impractical, particularly for reducing power during any idle states where latency should be at or near zero (for entry into and exit from power-on states).

Another approach to reducing power consumption during idle states is to implement clock gating in hardware (i.e. without firmware control). In one example, whenever inactivity in a specific logic block or circuit is detected, the relevant clock signal is gated by a clock gater (i.e. a clock gating device) configured in hardware. Some clock gaters are automatically inserted into an overall processing circuit design by synthesis tools during the circuit/system design, while others are added manually into the design by device engineers. Clock gaters automatically inserted by synthesis tools may not be sufficient, since most of the power in an SSD is consumed by a clock tree of the controller and synthesis tools often do not insert clock gaters on the clock tree of the system. Therefore, additional clock gaters may need to be manually added into the design by engineers to achieve any significant power reduction. A main drawback with this approach is the resulting manual design complexity and the need to verify the functionality of the system in all logic cases, including corner logic cases (e.g. logic cases where multiple program logic boundary conditions are reached). Indeed, in an SSD controller design, there may be many such corner cases that cause the circuit to gate the clock even though a clock signal is need. And so, as practical matter, a clock gating hardware implementation may be too risky and, in some scenarios, the wakeup latency may be too large.

Herein, solutions are provided that reduce idle state power consumption (such as Active Idle power consumption) while avoiding or mitigating the issues noted above. In several examples described herein, an NVM data storage controller is configured to provide adaptive and hierarchical clock scaling, which operates to scale down the internal clocks of the controller for all processing sub-blocks that are in Active Idle (or in other similar idle states or non-busy or non-active states or conditions). By scaling a clock, it is meant herein that the frequency of the clock signal is increased or decreased. Scaling a clock up (or upscaling) means that the frequency of the clock signal is increased (i.e. made faster). Scaling a clock down (or downscaling) means that the frequency of the clock signal is decreased (i.e. made slower).

In some specific examples, the clock signal is scaled down by a factor of thirty-two to reduce power consumption during idle states, i.e. the frequency of the clock signal is divided by thirty-two (to, e.g., reduce a 3.2 gigahertz (GHz) system clock signal to only 100 megahertz (MHz). Whenever a specific sub-block is subsequently found to no longer be in the idle state, its clock signal is promptly scaled back up to the system clock frequency (e.g. back to 3.2 GHz). Moreover, when an entire hierarchy of components is in the idle state, the clock signal applied to the entire hierarchy is scaled down. By downscaling the clock for an entire hierarchy of components, power consumed by the clock tree is also saved. Hence, in these examples, the clock signals are not gated (to turn the clock off for an extended period of time) but are instead downscaled. It has been found in practical systems that downscaling the clock (by a sufficient amount) can achieve the same power reduction as might be achieved with gating the clocks. Yet, by hierarchically scaling the clocks of the controller, rather than gating the clocks, the aforementioned issues and risks can be avoided while achieving significant power reduction.

Exemplary Data Storage Controller Embodiments

FIG. 1 illustrates, at a high level, a data storage system 100 with a data storage controller 102 configured to provide hierarchical clock scaling. The data storage controller 102 controls access to a NAND 104 (or other NVM storage device) by a host device 106. For a NAND write operation, the data storage controller 102 receives data from the host device 106 (via a bus 108) and stores the data in the NAND 104 (via an internal bus 110). For a NAND read operation, the data storage controller 102 retrieves requested data from the NAND 104 (via a bus 110) and transfers the data to the host device 106 (via bus 108).

In the implementation example of FIG. 1, the data storage controller 102 includes a system clock generator 112 and a processing system 114 (such as an application specific integrated circuit (ASIC)) with a hierarchy of processing modules 116 and sub-modules 118 (which may also be referred to herein as components/sub-components or blocks/sub-blocks, etc.). As will be explained below, exemplary modules 116 may include components such as a low-density parity-check (LDPC) module, a front end (FE) host interface module (HIM) or a central processing unit (CPU). Exemplary sub-modules 118 may include lower level components such as direct memory access (DMA) modules or the individual processing engines of the LDPC. The system clock is distributed via a clock tree (not specifically shown) to the processing system 114 for further distribution to the modules 116 and sub-modules 118.

If a particular sub-module 118 becomes idle, its clock signal is scaled down (by, for example, a factor of thirty-two). This may be regarded as cycle-based clock scaling. If a particular module 116 determines that all of its sub-modules are idle, the clock signal for that module 116 and its sub-modules 118 is scaled down (again by, for example, a factor of thirty-two) to reduce the power consumed by that portion of the overall processing hierarchy. This may be regarded as operation-based clock scaling. If the overall processing system 114 determines that all of its modules are idle (e.g. it is in Active Idle), the clock signal for the entire processing system 114 is scaled down (again by, for example, a factor of thirty-two) to even more greatly reduce the power consumed by the overall data controller 102. This may be regarded as ASIC-based or ASIC-idle clock scaling. Once any sub-module 118 becomes active again, the corresponding module 116 is thus also activated, and the clock signal applied to that sub-module 118 and all higher-level module(s) is scaled back up to the system clock rate.

In the example of FIG. 1, the processing system 114 may be regarded as the top tier of a three-tier hierarchy, with the modules 116 forming the second tier of the hierarchy and the sub-modules 118 forming the third tier of the hierarchy. The number of tiers in the hierarchy may vary from system to system and so, in some examples, only two tiers might be provided, whereas, in other examples, four or more tiers are provided. In general, the number (N) of tiers can be arbitrary. Note also that not all modules 116 will necessarily have sub-modules 118 and the number of sub-modules 118 (if any) of a particular module 116 may vary from module to module. Some modules 116 may have a large number of sub-modules 118, whereas other modules may have one or none. The hierarchical scaling of the clock signal within the controller 102 may be entirely transparent to the host device 106 and to the NAND 104. Note also that FIG. 1 illustrates only selected features of an exemplary system. A more complete system configured in accordance with NVMe is described below.

Figure 2:
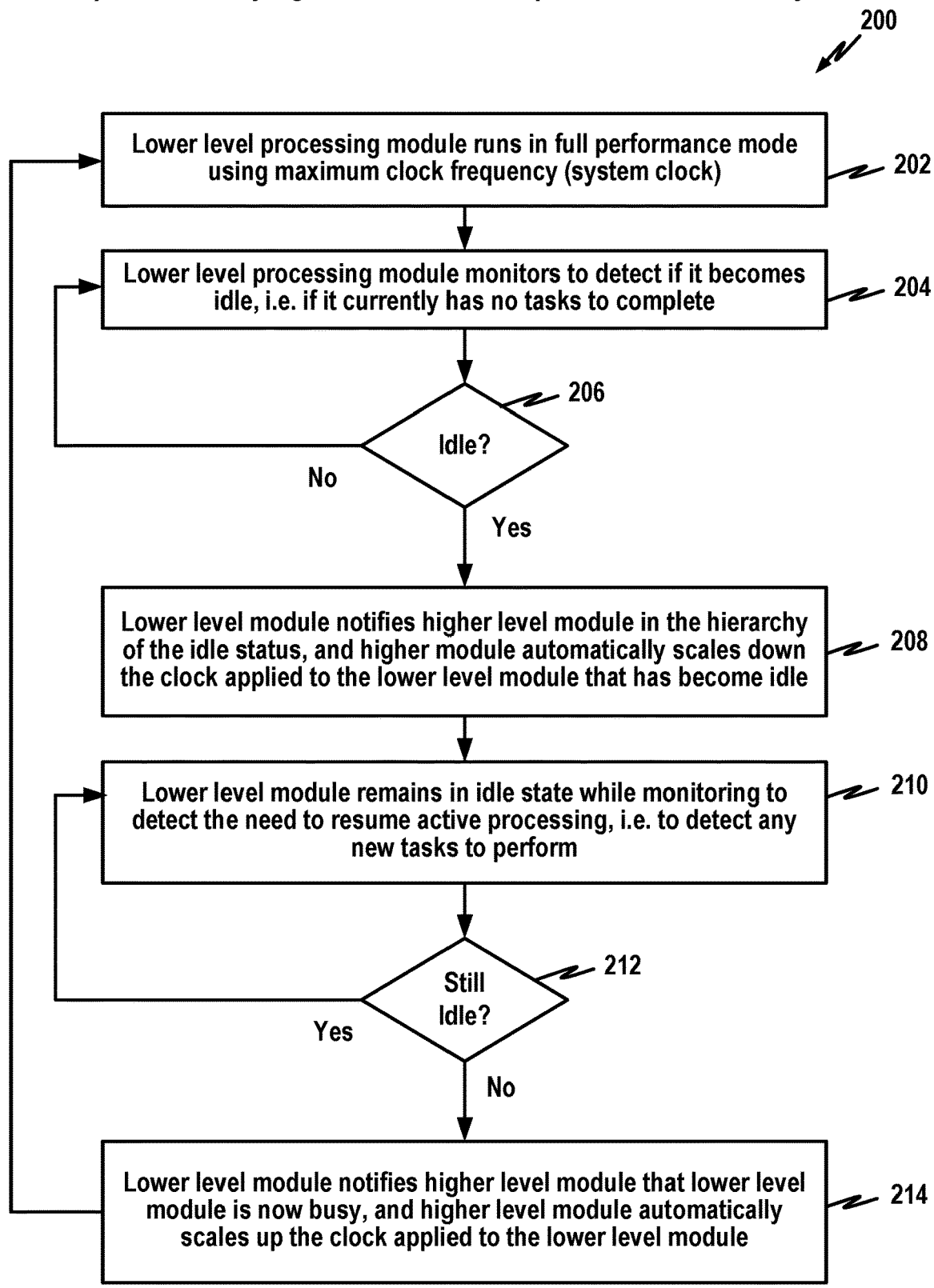
FIG. 2 illustrates an exemplary method for use by a lower level module/component to notify a higher level module/component of the idle/busy status of the lower level component.

FIG. 2 illustrates some of these features within a flowchart 200 that highlights exemplary operations for use by a lower level processing module (or block or component, etc.) to notify a higher level processing module (or block or component, etc.) of its idle/busy status. Briefly, at 202, the lower level processing module runs in full performance mode using the maximum clock frequency (e.g. the system clock). At 204, the lower level processing module monitors to detect if it becomes idle, i.e. if it currently has no tasks to complete. If idle, as determined at decision block 206, the lower level module, at 208, notifies higher level module in the hierarchy of the idle status. The higher module automatically scales down the clock applied to the lower level module that has become idle. At 210, the lower level module remains in the idle state while monitoring to detect the need to resume active processing, i.e. to detect any new tasks to perform. If no longer idle, as determined at decision block 212, the lower level module, at 214, notifies the higher level module that the lower level module is now busy. The higher level module automatically scales up the clock applied to the lower level module.

Figure 3:
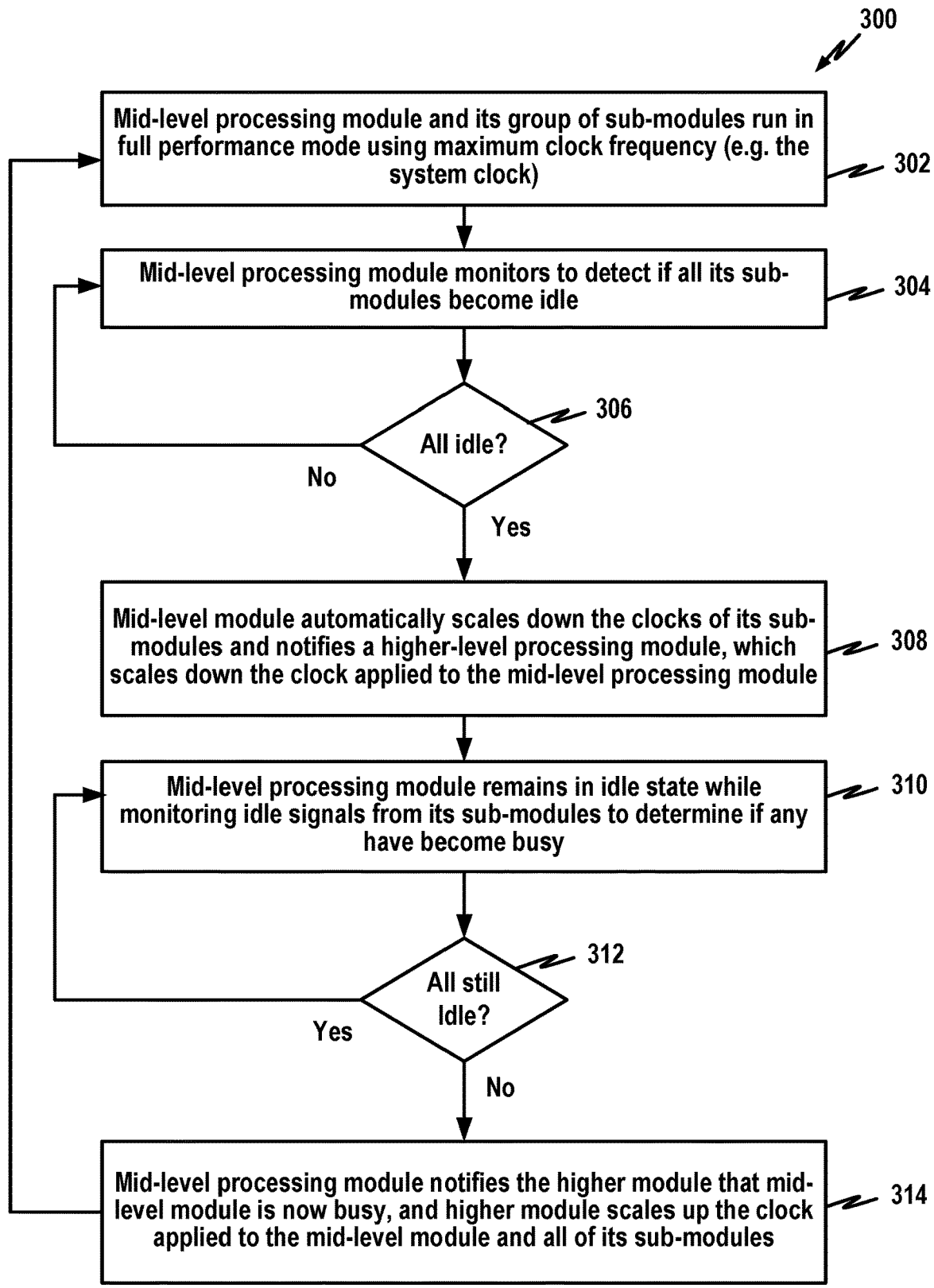
FIG. 3 illustrates an exemplary method for use by a mid-level module/component to downscale the clock signals applied to lower level modules/components.

FIG. 3 illustrates some of these features within a flowchart 300 that highlights exemplary operations for use by a mid-level processing module (or block or component, etc.) to control clock signals applied to lower level processing modules (or blocks or components, etc.). Briefly, at 302, the mid-level processing module and its group of sub-modules run in full performance mode using maximum clock frequency (e.g. the system clock). At 304, the mid-level processing module monitors to detect if all its sub-modules become idle. If all are idle, as determined at decision block 306, the mid-level level module, at 308, automatically scales down the clocks of its sub-modules and notifies a higher-level processing module, which scales down the clock applied to the mid-level processing module. At 310, the mid-level processing module remains in idle state while monitoring idle signals from its sub-modules to determine if any have become busy. If all are not still idle, i.e. at least one lower level module is now busy, as determined at decision block 312, the mid-level level module, at 314, notifies the higher module that the mid-level module is now busy, and the higher module scales up the clock applied to the mid-level module and all of its sub-modules.

Figure 4:
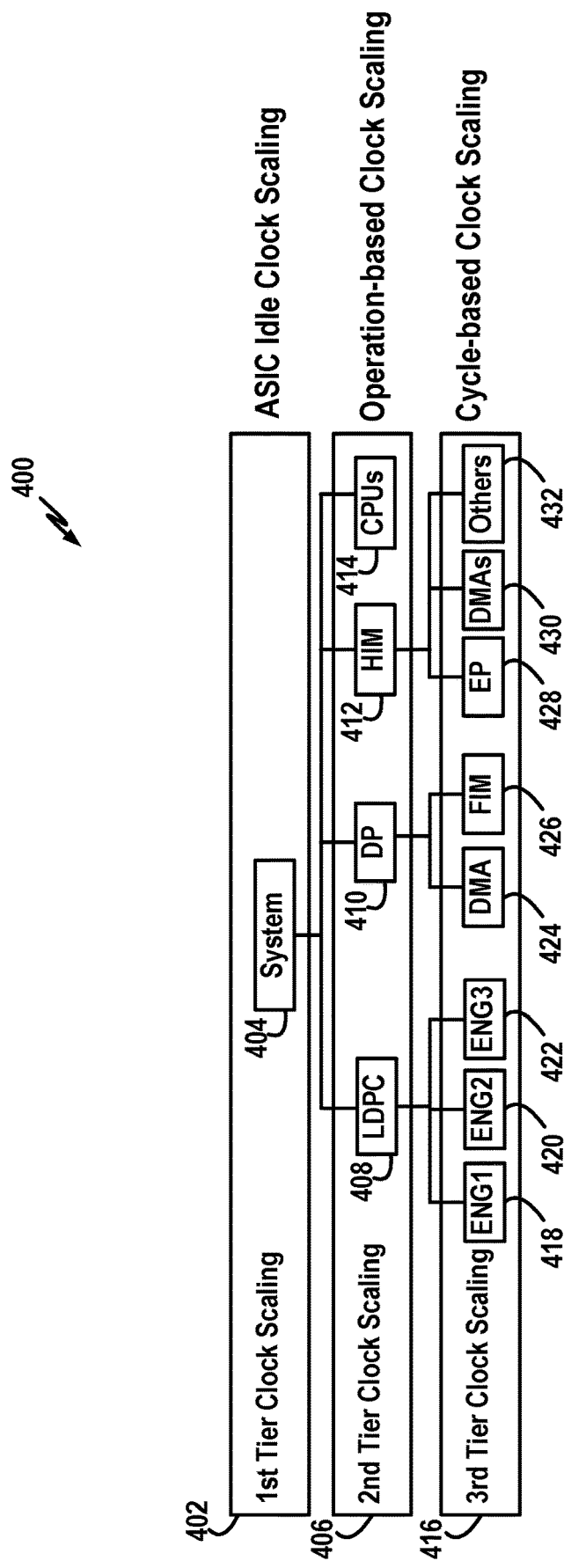
FIG. 4 is a block diagram illustrating a system having three clock scaling tiers.

FIG. 4 illustrates a hierarchical clock scaling within a block diagram 400 that highlights some particular and exemplary modules/blocks/components with different tiers of the hierarchy. Briefly, a top-level or first tier 402 is a "system level" tier, in which ASIC idle clock scaling is performed, i.e. the clock signal applied to the entire ASIC that forms a processing system 404 is scaled down. A mid-level or second tier 406 is a "block level" tier, in which operation-based clock scaling is performed. In the example of FIG. 4, the second tier includes an LDPC module 408, a data path (DP) module 410, an HIM 412, and one or more CPUs 414. A lower-level or third tier 416 is a "sub-block level" tier, in which cycle-based clock scaling is performed. In the example of FIG. 4, the LDPC 408 includes three error correction (EC) engines ENG1 418, ENG2 420, and ENG3 422. The DP 410 includes a direct memory access (DMA) 424 and a flash interface module (FIM) 426. The HIM 412 includes an end path (428), other DMAs 430 and still other components 432. Although not shown, the CPU(s) 414 might have sub-components, as well, that can be individually clock-scaled.

Figure 5:
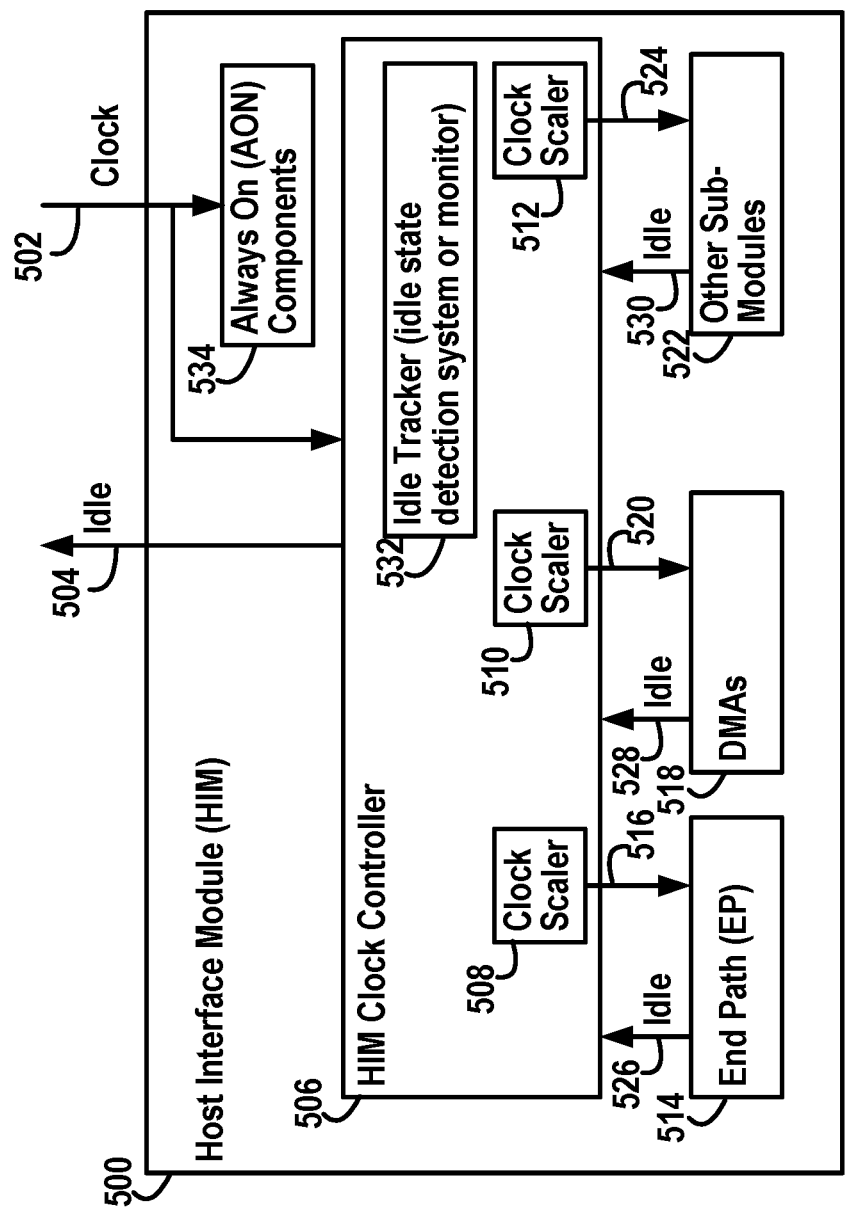
FIG. 5 illustrates an exemplary host interface module (HIM) and its sub-components, and particularly illustrating various clock scalers for downscaling clock signals.

FIG. 5 illustrates clock control components within an exemplary block/module/component, in this case the HIM module 500. The HIM 500 receives a clock signal 502 from a higher level component (such as a processing system ASIC as shown in FIG. 4) and selectively outputs an idle signal 504 to the higher level component. The input clock signal 502 may be, for example, at the highest system clock rate. The output idle signal 504 is selectively asserted only when the HIM 500 and all of its sub-modules or sub-blocks are idle. In the example of FIG. 5, the clock signal 502 is applied to a HIM clock controller 506, which includes a set of individual clock scalers 508, 510 and 512, one for each sub-module or sub-block of the HIM. In particular, clock scaler 508 applies a version of the clock signal to an EP module 514 along an internal clock line 516; clock scaler 510 applies a version of the clock signal to DMAs 518 along an internal clock line 520; and clock scaler 512 applies a version of the clock signal to one or more other sub-modules 522 along internal clock lines 524. (Although not shown in FIG. 5, if there are two or more other sub-modules 522, each of the other sub-modules may have its own clock scaler and corresponding clock and idle signal lines.)

Whenever any particular sub-module of the HIM 500 detects that it is idle (i.e. the particular sub-module is idle), the particular sub-module asserts an idle signal back to the HIM clock controller 506. In particular, the EP 514 asserts an idle signal along internal idle line 526; the DMAs 518 asserts its idle signal along internal idle line 528; and the other sub-modules 522 assert an idle signal along internal idle line 530. Upon receiving an idle signal from EP 514, the HIM clock controller 506 controls the clock scaler 508 to scale down the clock applied to the EP 514. Likewise, upon receiving an idle signal from DMAs 518, the HIM clock controller 506 controls the clock scaler 510 to scale down the clock applied to the DMAs 518 and, upon receiving an idle signal from the other sub-modules 522, the HIM clock controller 506 controls the clock scaler 512 to scale down the clock applied to the other sub-modules 522.

Whenever all of the sub-modules of the HIM 500 are found to be idle, as may be determined by an idle tracker 532 (e.g. an idle state detection system or monitor), the HIM 500 asserts its idle signal back to the higher level component along line 504, which responds by scaling down the clock signal applied to the HIM 500 along line 502. Note that, in the example of FIG. 5, the HIM 500 includes some circuits or components that are always on (AON), i.e. AON components 534, such as counters or the like that a never considered idle. In some examples, the system is configured so that the clock signals to the AON components 534 are never scaled down and so the AON components 534 always run at the highest clock rate (i.e. the system clock). In other examples, the clock signal to the AON components 534 is scaled down when the HIM 500 is scaled down.

Whenever any particular sub-module of the HIM 500 detects that it has tasks to perform (i.e. the particular sub-module is no longer idle but is now busy), the particular sub-module stops asserting the idle signal back to the HIM clock controller 506 (or asserts a busy signal, if so configured). The HIM clock controller 506 responds by scaling the clock signal applied to that particular sub-module back up to allow it to resume functioning at the higher clock rate. If the entire HIM 500 was in an idle state (because all of its sub-modules were previously idle), the activation of any or all of the sub-modules of the HIM 500 causes the HIM 500 to become busy again and, in response, the HIM 500 stops asserting its idle signal up to the higher level component (or asserts a busy signal, if so configured). In response, the higher level component scales up the clock signal applied to the HIM 500 along line 502.

Figure 6:
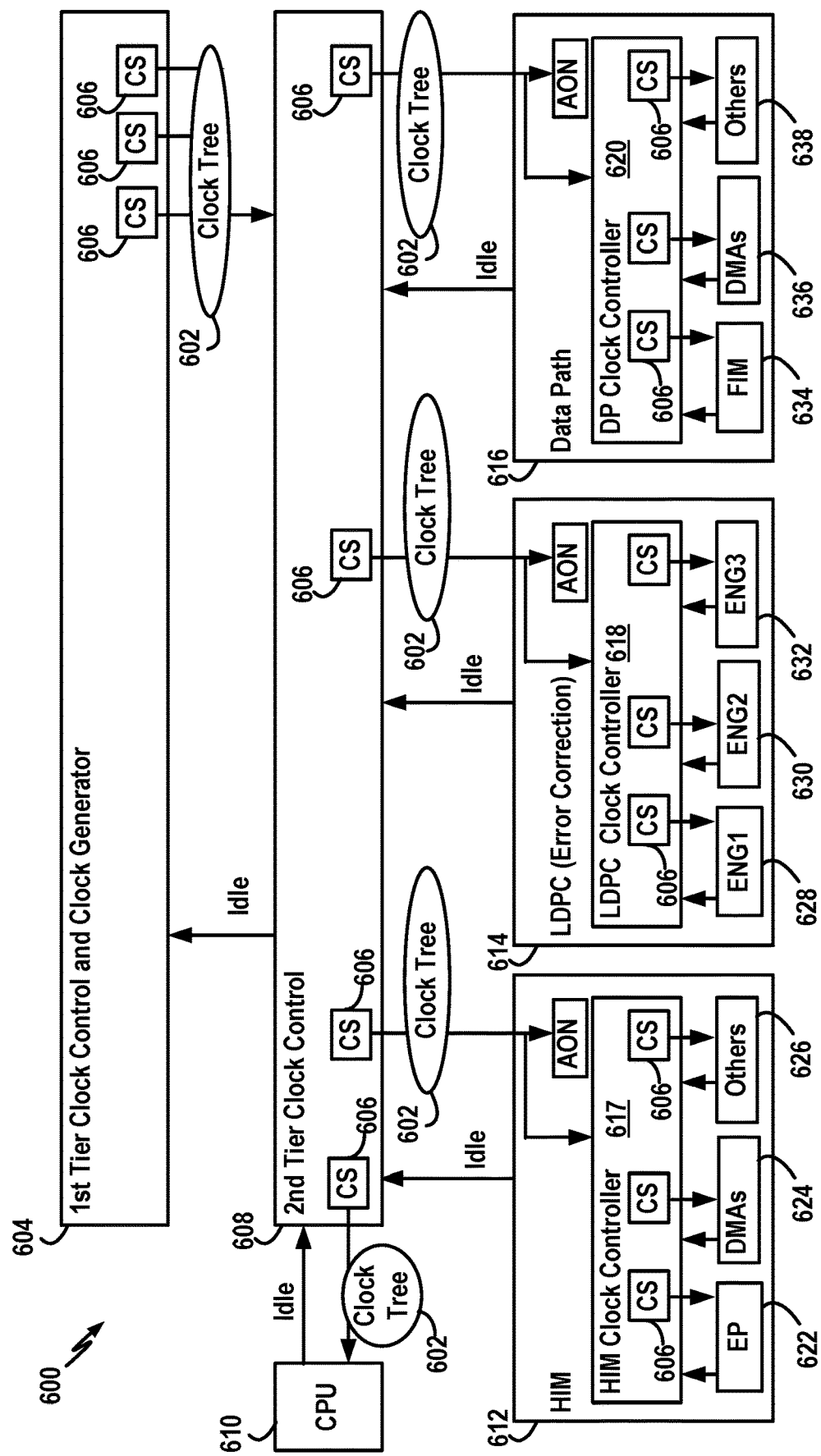
FIG. 6 illustrates an exemplary system having an HIM and other processing blocks or modules, and particularly illustrating an overall clock tree and the various clock scalers used for downscaling different versions of the clock distributed via the clock tree.

FIG. 6 provides a system-wide illustration of a processing system 600 where the figure highlights components of the overall clock tree 602. A first (1st) tier clock control and clock generator component 604 includes several clock scalers 606, one for each of several second (2nd) tier clock control components 608, only one of which is shown in FIG. 6. One version of the clock signal (of the clock tree 602 output from the first tier component 604) is received by the second tier clock control component 608 of the figure, which routes versions of the clock signal via additional clock scalers 606 to a CPU 610, a HIM 612, an LDPC 614 (or other error correction system) and a data path (DP) 616 along clock lines that form other portions of the clock tree 602. Additional clock scalers 606 within a HIM clock controller 617, an LDPC clock controller 618 and a DP clock controller 620 route versions of the clock signals to individual sub-components, such as the various DMAs and LDPC engines, discussed above. More specifically, and as shown, the sub-modules of FIG. 6 include: an EP 622, DMAs 624, other sub-modules 626 of the HIM 612; an ENG1 628, ENG2 630, and ENG3 632 of the LDPC 614; and a FIM 634, DMAs 636, and other sub-modules 638 of the DP 616.

Additionally, some systems may employ multiple clock domains or multi-clock domains where the separate clock domains are asynchronous. In a system with asynchronous multi-clock domains, separate hierarchies may be defined and exploited. That is, some modules may receive clock signals from one domain, while others receive clock signals from another domain. Clock scaling may differ from one domain to another, with one clock tree being scaled, while another is not scaled. Still further, in some examples, particular sub-modules may receive signals from several asynchronous clock domains and thus participate in several clock hierarchies. One domain may be idle while other domains are busy.

Figure 7:
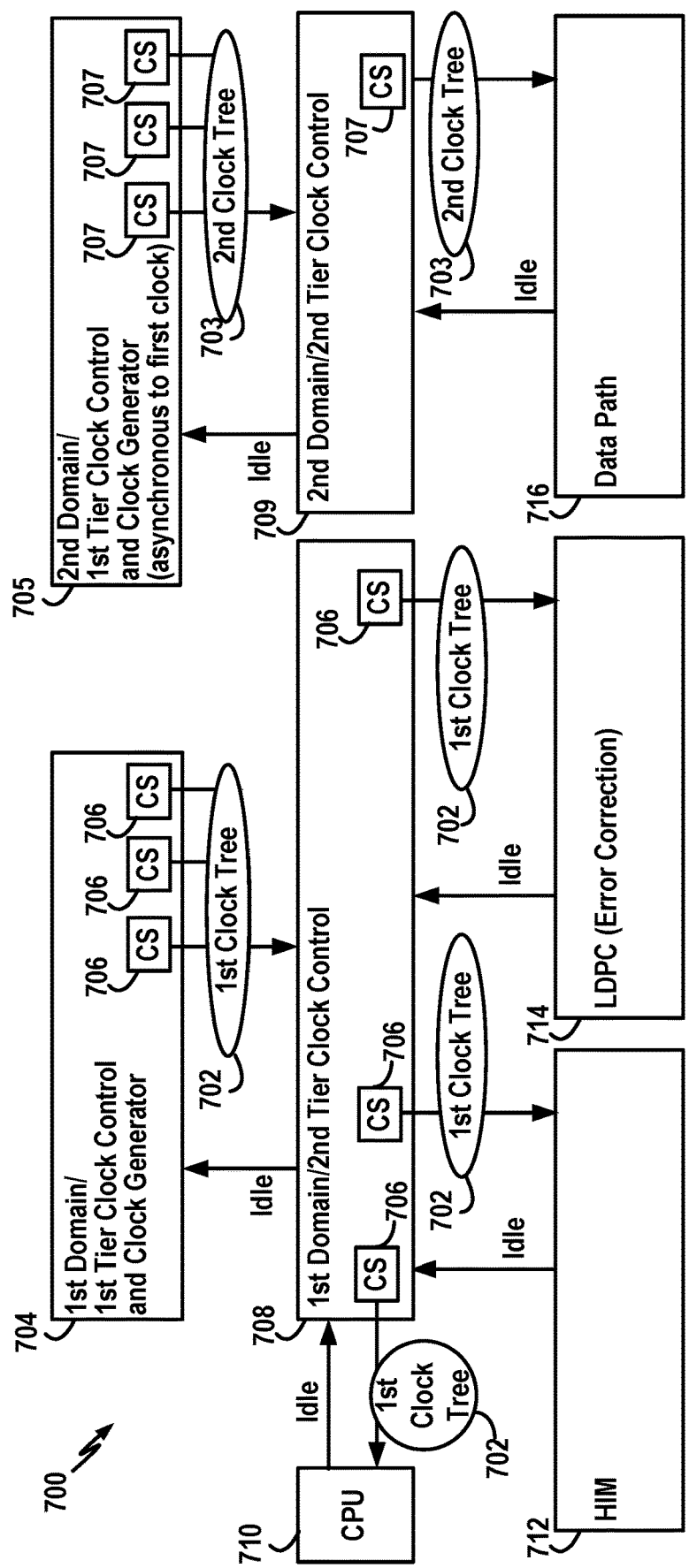
FIG. 7 illustrates an exemplary system having first and second asynchronous clock domains, both with a separate clock tree.

FIG. 7 illustrates a processing system 700 having two asynchronous clock domains, with separate clock trees 702 and 703. Briefly, a first domain/first tier clock control and clock generator component 704 includes several clock scalers 706, one for each of several first domain/second tier clock control components 708, only one of which is shown in FIG. 7. One version of the first domain clock signal (of the clock tree 702 output from the first domain/first tier component 704) is received by a first domain/second tier clock control component 708, which routes versions of the first domain clock signal via additional clock scalers 706 to a CPU 710, a HIM 712 and an LDPC 714. Additional clock scalers 706, not shown, may be provided within the HIM 712 and the LDPC 714 to route versions of the clock signals to individual sub-components, not specifically shown. Meanwhile, a second domain/first tier clock control and clock generator component 705 includes several clock scalers 707, one for each of several second domain/second tier clock control components 709, only one of which is shown in FIG. 7. One version of the second domain clock signal (of the clock tree 703 output from the second domain/first tier component 705) is received by a second domain/second tier clock control component 709, which routes versions of the second domain clock signal via additional clock scalers 707 to a DP 716. Additional clock scalers 707, not shown, may be provided within the DP 716 to route versions of the second domain clock signals to individual sub-components of the DP 716, not specifically shown. This is just one example of a system with two clock domains. As can be appreciated, in other examples, the various modules may be assigned differently to the two clock domains, with, e.g., the CPU 710 being in one domain and the other illustrated modules being in another domain, or additional clock domains may be used.

Figure 8:
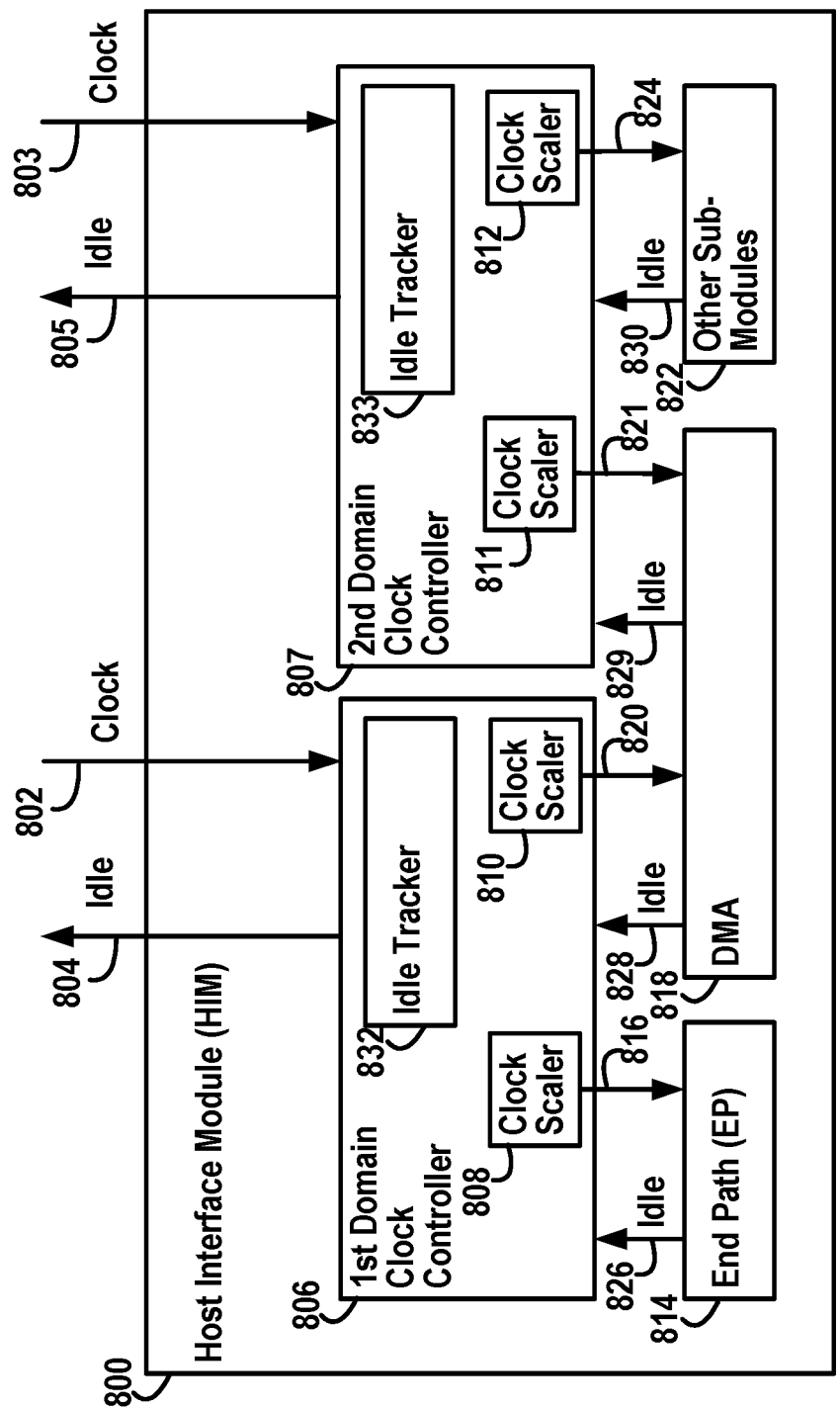
FIG. 8 illustrates an exemplary HIM that forms part of both the first and second clock domains, wherein at least some sub-modules are also part of both clock domains.

FIG. 8 illustrates first and second domain clock control components within an exemplary block/module/component, in this case the HIM module 800. And, in particular, FIG. 8 illustrates that a particular sub-module (in this case, DMAs 818) may receive signals from two asynchronous clock domains and thus participate in two separate clock hierarchies. Briefly, the HIM 800 receives a first domain clock signal 802 from a higher level first domain component and selectively outputs an idle signal 804 to the higher level first domain component. The input first domain clock signal 802 may be, for example, at the highest system clock rate. The output idle signal 804 is selectively asserted when the sub-modules (or sub-sub-modules) of the HIM 800 that are part of the first domain are idle. In the example of FIG. 8, the first domain clock signal 802 is applied to a first domain clock controller 806, which includes a set of individual first domain clock scalers 808 and 810. Clock scaler 808 applies a version of the first domain clock signal to an EP module 814 along an internal clock line 816. Clock scaler 810 applies a version of the first domain clock signal to DMAs 818 along an internal clock line 820.

Additionally, the HIM 800 receives a second domain clock signal 803 from a higher level second domain component and selectively outputs an idle signal 805 to the higher level second domain component. The input second domain clock signal 803 may be, for example, at a clock rate that is asynchronous from the first domain clock rate. The output idle signal 805 is selectively asserted only when the sub-modules (or sub-sub-modules) of the HIM 800 that are part of the second domain are idle. In the example of FIG. 8, the second domain clock signal 803 is applied to a second domain clock controller 807, which includes a set of individual second domain clock scalers 811 and 812. Clock scaler 811 applies a version of the second domain clock signal to DMAs 818 along an internal clock line 821. Clock scaler 812 applies a version of the second domain clock signal to other submodules 822 along an internal clock line 824. Thus, the DMAs 818 receive clock signals from both domains and participate in both clock hierarchies. That is, some sub-components of the DMAs 818 may operate using a first domain clock signal while other sub-components of the DMAs 818 may operate using a second asynchronous domain clock signal. Separate idle signals 828, 829 are thus generated.

Whenever a first domain sub-module of the HIM 800 detects that it is idle, the sub-module asserts an idle signal back to the first domain clock controller 806. For example, the EP 814 asserts an idle signal along internal idle line 826. Whenever a second domain sub-module of the HIM 800 detects that it is idle, the sub-module asserts an idle signal back to the second domain clock controller 806. For example, the other sub-modules 822 assert an idle signal along internal idle line 830. The DMAs 818 asserts a first idle signal along internal idle line 828 if all of its sub-components that are part of the first clock domain are idle and also asserts a second idle signal along internal idle line 829 if all of its sub-components that are part of the second clock domain are idle. Upon receiving an idle signal, the clock scalers downscale the clocks applied to their respective sub-modules (as explained above).

Whenever all of the sub-modules of the HIM 800 in the first clock domain are found to be idle, as may be determined by a first domain idle tracker 832, the HIM 800 asserts a first domain idle signal back to the higher level first domain component along line 804, which responds by scaling down the first domain clock signal applied to the HIM 800 along line 802. Whenever all of the sub-modules of the HIM 800 in the second clock domain are found to be idle, as may be determined by a second domain idle tracker 833, the HIM 800 asserts a second domain idle signal back to the higher level second domain component along line 805, which responds by scaling down the second domain clock signal applied to the HIM 800 along line 803. Although not shown AON components also may be provided within that HIM 800.

Whenever any particular sub-module of the HIM 800 that is in the first clock domain detects that it has tasks to perform, the particular sub-module stops asserting the idle signal back to the corresponding clock controller 806 or 807. The corresponding clock controller 806 or 807 responds by scaling the corresponding clock signal applied to that particular sub-module back up to allow it to resume functioning at a higher clock rate.

Figure 9:
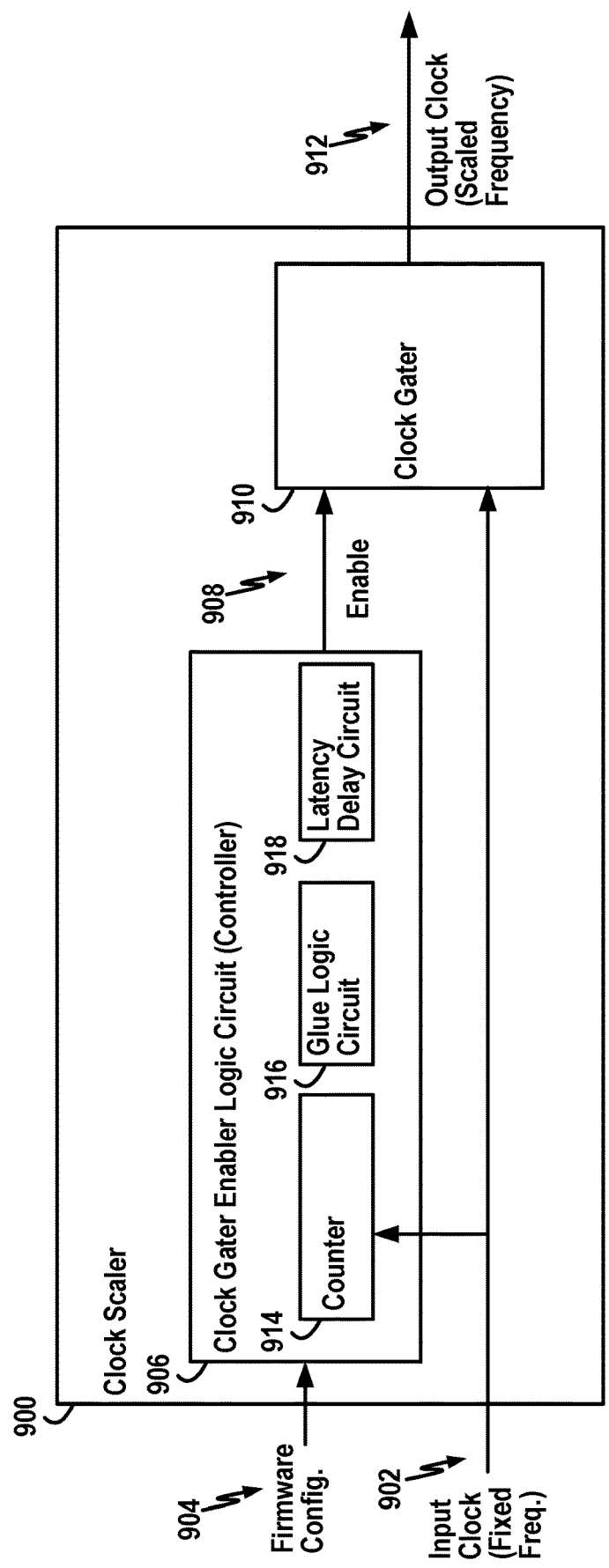
FIG. 9 illustrates an exemplary clock scaler and its components.

FIG. 9 illustrates an exemplary clock scaler (CS) 900. An input clock signal 902 is received along an input line at a fixed frequency. This may be a version of the system clock. A firmware configuration signal 904 is also applied to the clock scaler 900, which may be used to specify the amount of clock scaling to apply to the clock signal 902. (The firmware configuration signal 904 may be generated using firmware, not shown in FIG. 9, that is used to control and configure the overall controller in which the various clock scalers are implemented. The configuration signal 904 is applied to a clock gater enabler logic circuit 906 (controller) that selectively generates an enable signal 908 for applying to a clock gater 910 of the clock scaler 900. The enable signal 908 toggles the clock gater 910 on/off to cause the clock gater 910 to scale the input clock signal 902 to generate a scaled output clock signal 912. That is, rather than simply gating the clock signal to turn it off for an extended period of time and then turn it back on later (as a clock gater would ordinarily do in many processors), the clock gater 910 is controlled to toggle the clock signal 902 to downscale its frequency from, e.g., 3.2 GHz to 100 MHz, to yield the scaled output signal 912. To downscale the clock 902 by that amount (i.e. 1/32), the clock gater 910 may be toggled by the enable signal 908 to temporarily gate the clock 902 for thirty-one clock cycles and then ungate the clock 902 for one clock cycles, thus reducing the clock frequency of the clock signal 902 by a factor of thirty-two.

A selected amount of downscaling may be achieved by using a counter 914 to count the on-going number of cycles in the input clock signal 902 so that every second, or fourth, or eighth, or sixteenth, or thirty-second clock cycle (depending on the firmware configuration signal 904 parameters) can be ungated via the clock gater 910 to achieve a programmed amount of downscaling. Glue logic circuitry 916 may also be employed to allow the clock scaler to work seamlessly with other components of the module or block that it is incorporated within. A latency (or grace period) delay circuit 918 may be used to delay the downscaling of the clock signal by a predetermined amount (e.g. four or eight clock cycles) to provide an amount of latency to filter out false or premature reporting of inactivity for several cycles.

Figure 10:
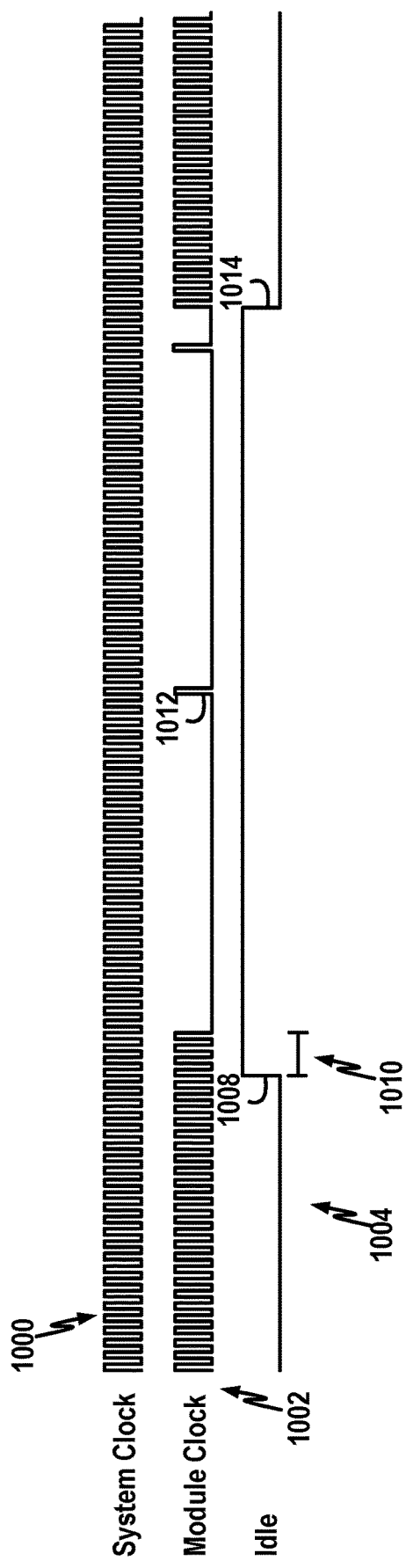
FIG. 10 illustrates the downscaling and subsequent upscaling of a clock signal applied to an individual module and particularly illustrating a downscaling latency delay.

FIG. 10 illustrates the downscaling and subsequent upscaling of an exemplary clock signal, which may be the clock signal applied to one of the blocks or modules of a data storage controller. As shown, a system clock 1000 runs at a high frequency. Initially, a module clock signal 1002 runs at the same frequency while the module is busy (as indicated by a corresponding idle signal 1004 being held low). At time 1008, the module becomes idle, which initiates or triggers a downscale delay interval or grace period 1010, during which time the module clock 1002 remains at its initial rate (i.e. the system clock rate). Following completion of the downscale delay interval 1010, the module clock signal 1002 is downscaled so that only an occasional clock pulse 1012 is applied to the module. In the example of FIG. 10, the module again becomes busy at time 1014 and the idle signal is deactivated so that the module clock 1002 can resume at its initial (high) frequency. Note that, in order to show both the downscaling and upscaling of the module clock in a single figure, FIG. 10 illustrates an abbreviated example where the module clock 1002 is downscaled for only are relatively short period of time. In practical systems, clock signals may be downscaled for much longer periods of time (in terms of the corresponding number of cycles of the system clock). Additionally, the downscale delay interval may be longer (or shorter) than as specifically shown in FIG. 10 and, in some examples, may be set using the firmware configuration signals discussed above.

Figure 11:
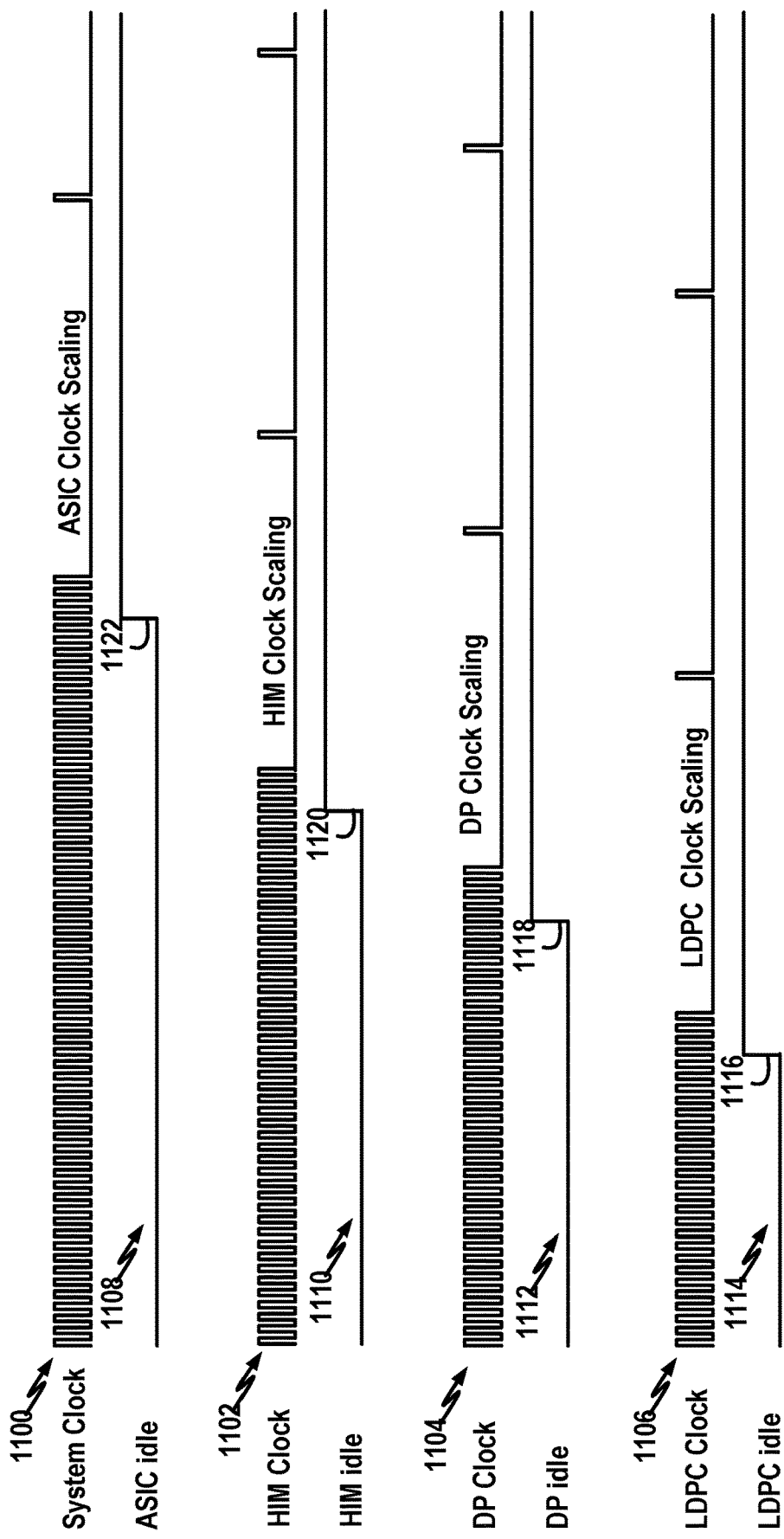
FIG. 11 illustrates the downscaling of several different clock signals applied to different modules and to the system clock, as well.

FIG. 11 illustrates the downscaling of several clock signals corresponding to different blocks or modules of a data storage controller. As shown, a system clock 1100 again runs at a high frequency. Initially, an HIM module clock signal 1102, a DP module clock signal 1104, and an LDPC 1106 all run at the same high clock rate. Each module, include the ASIC on which the overall system if formed, has a corresponding idle signal, which is initially held low to indicate the corresponding component is not idle (i.e. it is busy). That is, the ASIC has an ASIC idle signal 1108, the HIM module has an HIM idle signal 1110, the DP module has a DP idle signal 1112, and the LDPC has an LDPC idle signal 1114. In the particular example of FIG. 11, the LDPC becomes idle at time 1116, thus causing the LDPC clock 1106 to be downscaled (after the above-described downscale delay interval), i.e. LDPC clock scaling begins. The DP becomes idle at time 1118, thus causing the DP clock 1104 to be downscaled (after the delay interval), i.e. DP clock scaling begins. The HIM becomes idle at time 1120, thus causing the HIM clock 1102 to be downscaled (after the delay interval), i.e. HIM clock scaling begins. The ASIC on which the system is formed becomes idle at time 1122, thus causing the system clock 1100 to be downscaled (after the delay interval), i.e. ASIC clock scaling begins.

Although not shown in FIG. 11, the clock of the CPU may be downscaled as well, after the CPU becomes idle. Additionally, note that, in order to show the downscaling of various clocks in a single figure, FIG. 11 illustrates an abbreviated example where the various clocks are downscaled one after the other in a relatively short period of time. In practical systems, the time between one module becoming idle and another becoming idle may occur over much longer periods of time (in terms of the corresponding number of cycles of the system clock). Moreover, the example of FIG. 11 shows the LDPC becoming idle first, followed by the DP, then the HIM, etc. This is just one example of a sequence by which the modules may become idle. In other examples, the order might be different.

In the following section, NVMe-based examples are described.

Exemplary NVMe Embodiments

Figure 12:
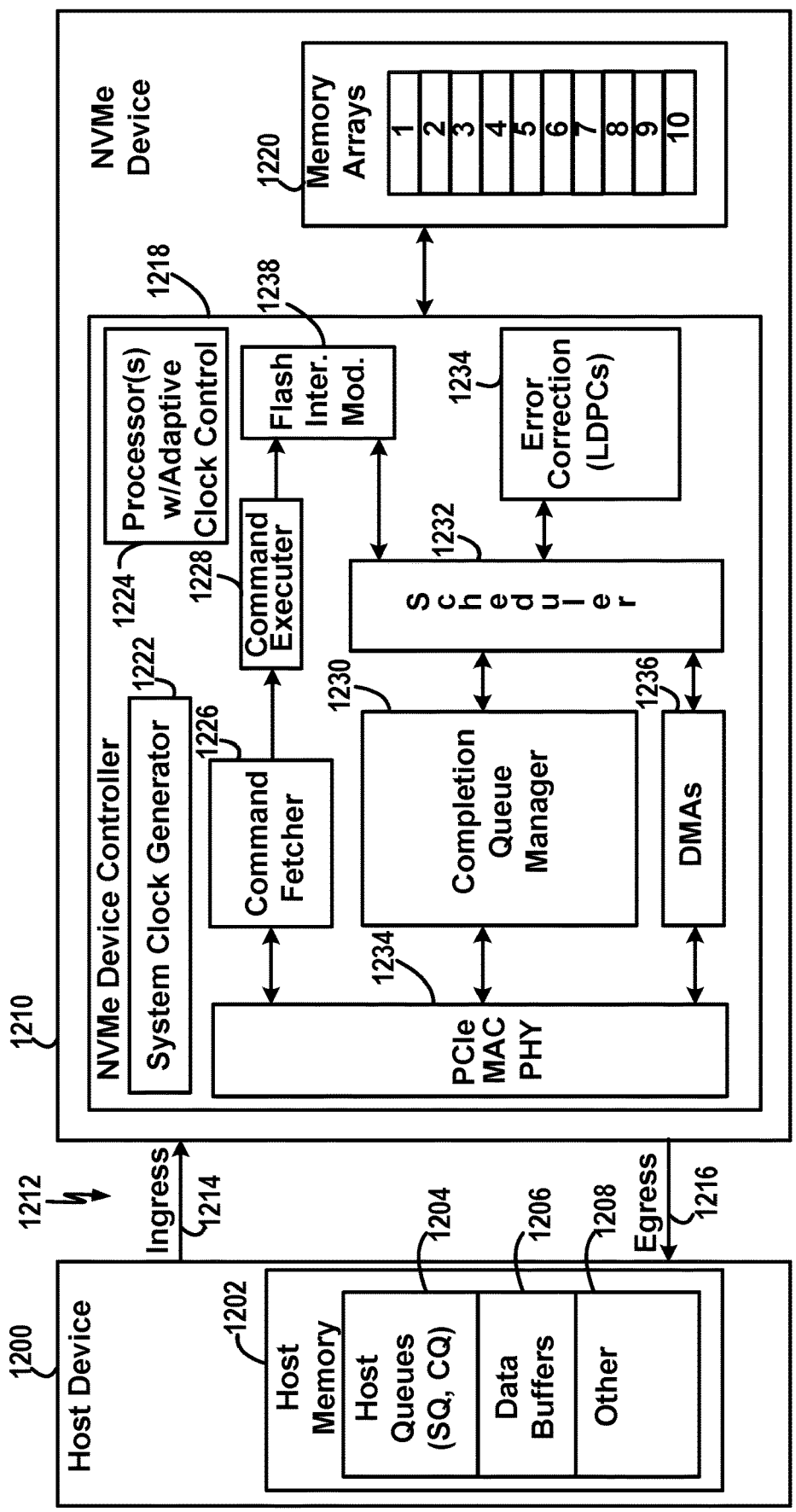
FIG. 12 illustrates a data storage system equipped for use with NVMe, where the data storage controller is equipped to adaptively and hierarchically scale clock signals within to, for example, reduce Active Idle power consumption within the data storage controller.

FIG. 12 illustrates certain features of an exemplary NVMe architecture in which the above-described hierarchical clock scaling systems and procedures may be implemented. In FIG. 12, a host device 1200 may be any suitable computing or processing platform capable of accessing memory on an NVM data storage device using NVMe procedures. For example, host device 1200 may be a desktop personal computer, a laptop computer, a tablet computer, a mobile telephone, or a front end to a storage array. The host device 1200 includes internal memory 1202, which in this example is dynamic random access memory (DRAM). The host memory 1202 may be configured to include, as shown, various host submission queues (SQs) and completion queues (CQs) 1204, data buffers 1206 and other memory components 1208. The host device 1200 may store data in an NVMe storage device 1210. The NVMe device 1210 may be any suitable device that provides non-volatile memory storage for host device 1200 in accordance with NVMe standards. For example, the NVMe device 1210 may be a removable storage device, such as a flash SSD that is removably connectable to host device 1200. In another example, the NVMe device 1210 may be non-removable or integrated within the host device 1200. In some embodiments, the host device 1200 and the NVMe device 1210 are communicatively connected via a PCIe bus 1212 (including ingress 1214 and egress 1216).

The NVMe storage device 1210 of FIG. 12 includes an NVMe controller 1218 and a non-volatile memory 1220. The NVMe controller 1218 controls access to the non-volatile memory 1220 such as a NAND. The NVMe controller 1218 thus may be a non-volatile memory controller that implements or supports the NVMe protocol, and non-volatile memory 1220 may be 2D or 3D NAND flash memory. The NVMe controller includes a system clock generator 1222 and one or more processors 1224 configured to provide adaptive and hierarchical clock control using systems and procedures already described. That is, although not specifically shown in FIG. 12, a clock tree may supply different versions of the system clock signal to various components and sub-components within the controller 1218, with the various versions downscaled and later upscaled based on the idle/busy status of the various modules. The processor(s) 1224 are also responsible for the execution of Frond-End and Back-End tasks.

In use, a command fetcher 1226 of the NVMe controller 1218 fetches commands from the submission queues within the host memory 1202 and forwards the commands to a command executer 1228. The command fetcher 1226 is responsible for fetching and parsing the commands from the host and queuing them internally and may form part of a FE/HIM of the NVMe controller 1218. The command executer 1228 is responsible for the arbitrating and executing the commands. Upon completion of the commands, the NVMe controller 1218 generates completion entries that are ultimately directed to the completion queues within the host memory 1202. A completion queue manager 1230 is responsible for managing the host completion queues. Among other functions, the completion queue manager 1230 routes completion entries received from a scheduler 1232 to a completion queue within the host device 1200 via a PCIe MAC PHY interface 1234.

Actual pages of data to be delivered to the host device 1200 (such as the result of read commands applied to the NVM memory arrays 1220) are delivered to the host device 1200 using one or more DMAs 1236. Additional components of the NVMe controller 1218 shown in FIG. 12 include a flash interface module (FIM) 1238, which is responsible for controlling and accessing the memory arrays 1220, and an error correction module 1240, which is responsible for error correction and may include various LDPC engines. Note that, in an exemplary implementation, the only components modified relative to a conventional NVMe controller are the clock signal distribution components (including the various clock scalers, etc., described above) and any firmware or processor components for controlling the clock scaling (such as by selecting the amount of scaling to be applied). The scaling of clock signals within the data storage controller 1218 is otherwise transparent to the various components of the NVMe device 1210, as well as the host device 1200.

Thus, methods and apparatus have been described that provide for hierarchical and adaptive clock scaling where each sub-module (or sub-block/sub-component) scales down its clock whenever detecting inactivity and sends an idle notification to a higher level module. Each module in the hierarchy is capable of scaling down its internal clocks and sending idle notifications to a higher level module in the hierarchy. Among other advantages, the exemplary procedures described herein may serve to significantly reduce the power consumed by the device controller in the Active Idle state (or other similar idle states). In some examples, power reduction of 30% is achieved while a data storage controller is in the Active Idle state.

Further Exemplary Methods and Embodiments

Figure 13:
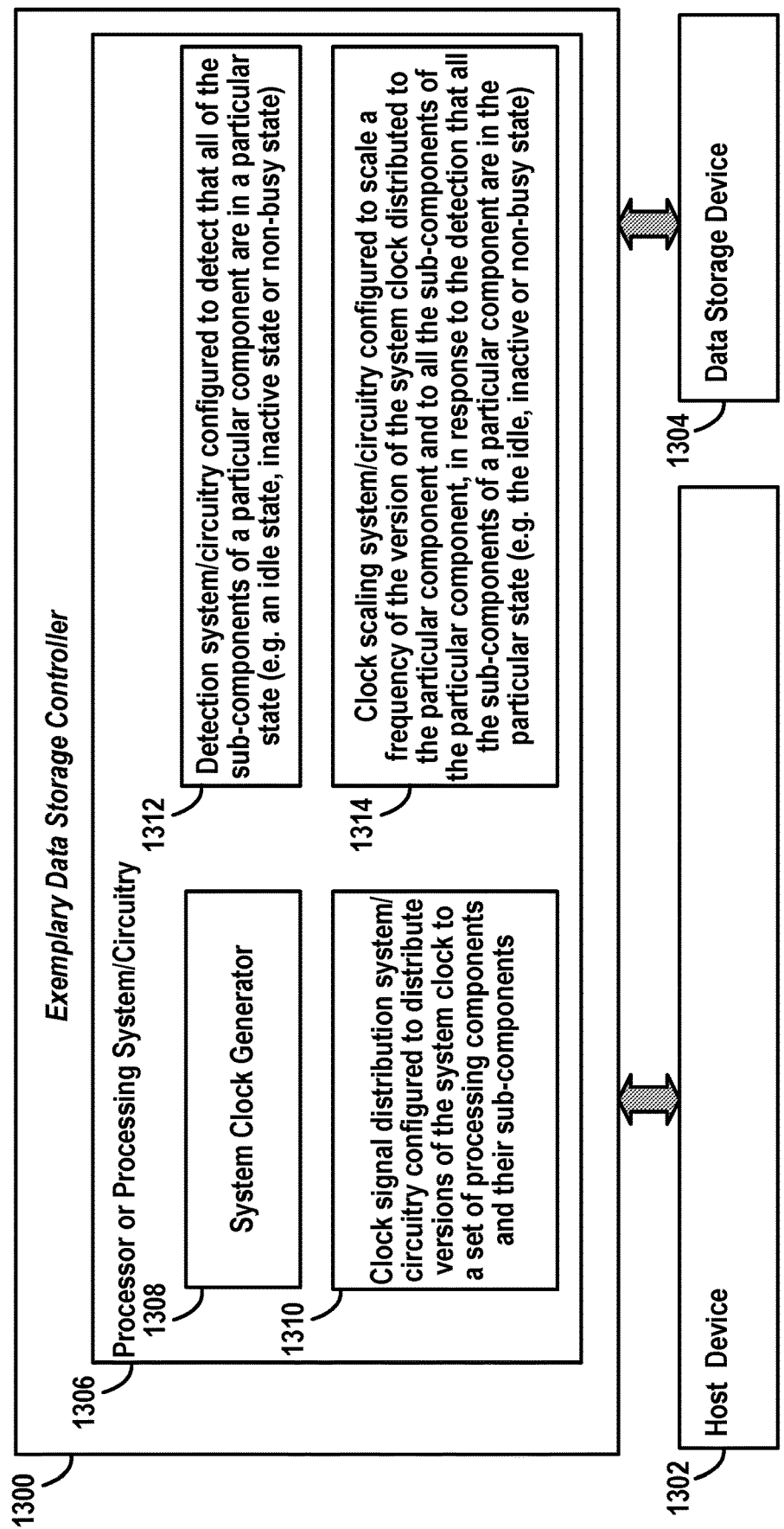
FIG. 13 is a high-level block diagram summarizing selected features of a data storage controller equipped to adaptively and hierarchically scale clock signals.
Figure 14:
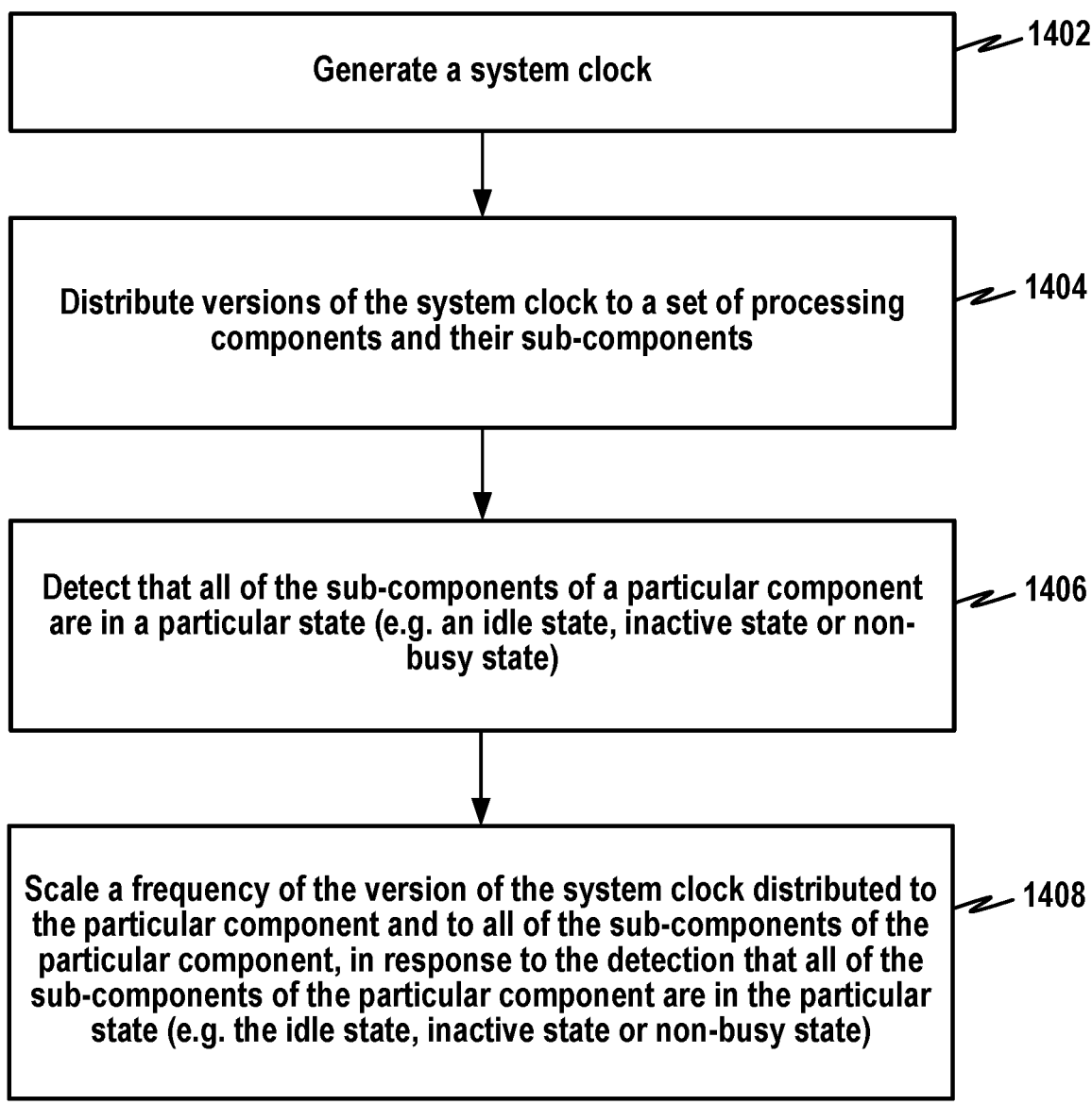
FIG. 14 is a flow chart summarizing selected operations of a data storage controller or other suitable device equipped to adaptively and hierarchically scale clock signals.
Figure 15:
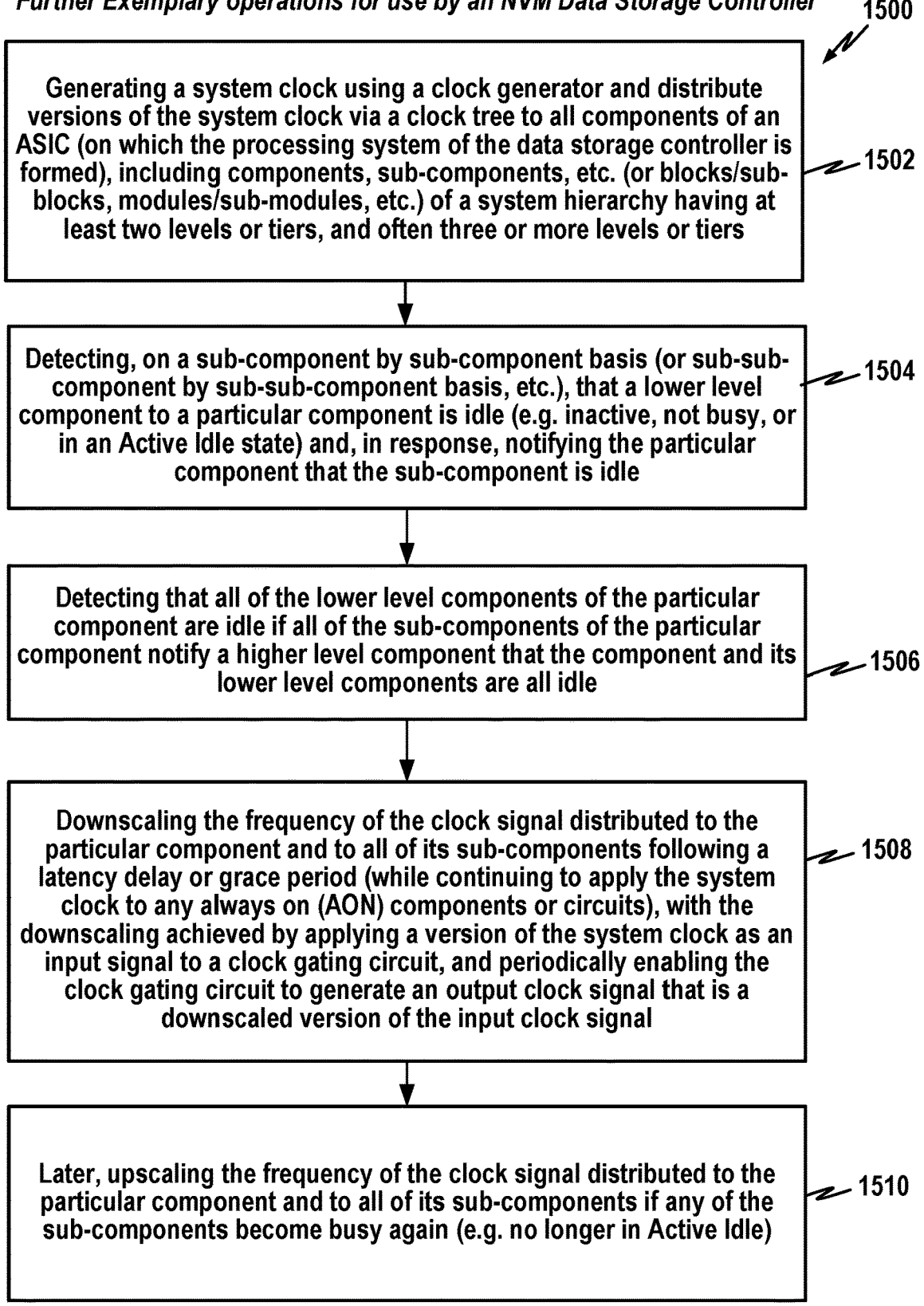
FIG. 15 is a flow chart summarizing further operations of a data storage controller or other suitable device equipped to adaptively and hierarchically scale clock signals.

FIGS. 13-15 illustrate and summarize various general features of exemplary data storage controllers and methods, or procedures for use with data storage controllers.

FIG. 13 shows an exemplary data storage controller 1300 (or memory controller or device controller) configured to communicate with a host device 1302 and a data storage device 1304, wherein the data storage controller 1300 may access the data storage device 1304 based on commands issued to the data storage controller 1300 by the host device 1302. Although many examples described herein relate to NVMe controllers for storing data within NAND devices, the data storage device 1304 may be any suitable memory or storage device and is not limited to NANDs, and the data storage controller 1300 may be any suitable memory controller device and is not limited to NVMe-based controllers. Moreover, although many examples herein relate to downscaling clock signals during an Active Idle state, the idle state or other idle condition that triggers the change in clock rate is not limited to Active Idle and can include other non-busy or non-active or inactive states or conditions.

The exemplary data storage controller 1300 of FIG. 13 includes a processor, processing system, or processing circuitry 1306 configured for: (a) generating a system clock; (b) distributing versions of the system clock to a set of processing components and their sub-components; (c) detecting that all of the sub-components of a particular component are in a particular state (e.g. an idle state, inactive state or non-busy state); and (d) scaling a frequency of the version of the system clock distributed to the particular component and to all of the sub-components of the particular component, in response to the detection that all of the sub-components of a particular component are in the particular state (e.g. the idle state, inactive state or non-busy state). In particular, the exemplary processor, processing system, or circuitry 1306 includes a system clock generator 1308 configured to generate a (high frequency) system clock; a clock signal distribution system, component, or circuitry 1310 configured to distribute versions of the system clock to a set of processing components and their sub-components (such as the various processing modules or blocks shown in FIGS. 4-8); a detection system, component, or circuitry 1312 configured to detect that all of the sub-components of a particular component are in a particular state (e.g. an idle state, inactive state or non-busy state); and a clock scaling system, component, or circuitry 1314 configured to scale a frequency of the version of the system clock distributed to the particular component and to all of the sub-components of the particular component, in response the detection that all of the sub-components of a particular component are in the particular state (e.g. an idle state, inactive state or non-busy state).

In at least some examples, means may be provided for performing the functions illustrated in FIG. 13 and/or other functions illustrated or described herein. For example, an apparatus (e.g. processing system or circuitry 1306) may be provided for use with a data storage system or device (e.g. data storage controller 1300 or data storage device 1304) where the apparatus includes: means (such as clock generator 1308) for generating a system clock; means (such as circuitry 1310 of FIG. 13 or clock tree 602 of FIG. 6) for distributing versions of the system clock to a set of processing components and their sub-components; means (such as circuitry 1312 of FIG. 13 or idle tracker 532 of FIG. 5) for detecting that all of the sub-components of a particular component are in a particular state; and means (such as circuitry 1314 of FIG. 13 or the second tier clock scalers 606 of FIG. 6) for scaling a frequency of the version of the system clock distributed to the particular component and to all of the sub-components of the particular component, the scaling in response to the detection that all of the sub-components of the particular component are in the particular state.

The means for detecting that all of the sub-components of a particular component are in the idle state may include: means (such as the various idle trackers 532 of FIG. 5) for detecting, on a sub-component by sub-component basis, that any particular sub-component of the particular component is idle; and means (such as idle line 504 of FIG. 5) for notifying the particular component that the particular sub-component is idle. The set of processing components and their sub-components may form a hierarchy of processing components, and wherein the hierarchy includes at least two levels of processing components. The hierarchy may include at least three levels of processing components. At least one of the sub-components may include a portion of circuitry that receives a version of the system clock that is not scaled. The means for scaling may include: means (such as signal line 902 of FIG. 9) for applying a version of the system clock as an input signal to a clock gating circuit: and means (such as controller 906 of FIG. 9) for periodically enabling the clock gating circuit to generate an output clock signal that is a scaled version of the input clock signal. Means for providing time delay may be provided, such as latency delay circuit 918 of FIG. 9. Means for storing information may be provided, such as the NAND 104 of FIG. 1. These are just some examples of suitable means for performing or controlling the various functions or operations described herein.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms. These are just some examples of suitable means for performing or controlling the various functions.

In at least some examples, a machine-readable storage medium may be provided having one or more instructions which when executed by a processing circuit causes the processing circuit to performing the functions illustrated in FIG. 13 and/or other functions illustrated or described herein. For example, instructions may be provided for: generating a system clock; distributing versions of the system clock to a set of processing components and their sub-components; detecting that all of the sub-components of a particular component are in a particular state; and scaling a frequency of the version of the system clock distributed to the particular component and to all of the sub-components of the particular component, the scaling in response to the detection that all of the sub-components of the particular component are in the particular state.

Other exemplary instructions may include: instructions for distributing the system clock via a clock tree; instructions for detecting whether a component or sub-component is an idle state; instructions for detecting, on a sub-component by sub-component basis, that any particular sub-component of the particular component is idle; and instructions for notifying the particular component that the particular sub-component is idle. The instructions for scaling may include: instructions for applying a version of the system clock as an input signal to a clock gating circuit: and instructions for periodically enabling the clock gating circuit to generate an output clock signal that is a scaled version of the input clock signal. Instructions for providing time delay may be provided. These are just some examples of suitable instructions for performing or controlling the various functions or operations described herein.

FIG. 14 broadly summarizes exemplary operations 1400 for use by or with a data storage controller or other suitable device to hierarchically scale clock signals. Briefly, at 1402, the data storage controller generates a system clock. At 1404, the data storage controller distributes versions of the system clock to a set of processing components and their sub-components. At 1406, the data storage controller detects that all of the sub-components of a particular component are in a particular state (e.g. an idle state, inactive state or non-busy state). At 1408, the data storage controller scales the frequency of the version of the system clock distributed to the particular component and to all of the sub-components of the particular component, in response to the detection that all of the sub-components of the particular component are in the particular state (e.g. the idle state, inactive state or non-busy state). As already discussed, clock signals can be hierarchically downscaled when all components in a portion of an overall hierarchy of components become idle (particularly within the Active Idle state) and can later be upscaled when any one of the downscaled components is again busy.

FIG. 15 further summarizes exemplary operations 1500 for use by or with a data storage controller or other suitable device to process completion values. At 1502, the data storage controller (or components thereof) generate a system clock using a clock generator and distribute versions of the system clock via a clock tree to all components of an ASIC (on which processing system of the data storage controller is formed), including components, sub-components, etc. (or blocks/sub-blocks, modules/sub-modules, etc.) of a system hierarchy having at least two levels or tiers, and often three or more levels or tiers. At 1504, the data storage controller (or components thereof) detect, on a sub-component by sub-component basis (or sub-sub-component by sub-sub-component basis, etc.), that a lower level component to a particular component is idle (e.g. inactive, not busy, or in an Active Idle state) and, in response, notify the particular component that the sub-component is idle. At 1506, the data storage controller (or components thereof) detects when or that all of the lower level components of the particular component are idle if all of the sub-components of the particular component notify a higher level component that the component and its lower level components are all idle. At 1508, the data storage controller (or components thereof) downscales the frequency of the clock signal distributed to the particular component and to all of its sub-components following a latency delay or grace period (while, in some examples, continuing to apply the system clock to any always on (AON) components or circuits), with the downscaling achieved by applying a version of the system clock as an input signal to a clock gating circuit, and periodically enabling the clock gating circuit to generate an output clock signal that is a downscaled version of the input clock signal. Later, at 1510, the data storage controller (or components thereof) upscale the frequency of the clock signal distributed to the particular component and to all of its sub-components if any of the sub-components become busy again (e.g. no longer in Active Idle).

The subject matter described herein can be implemented in any suitable NAND flash memory, including 2D or 3D NAND flash memory. Semiconductor memory devices include volatile memory devices, such as DRAM) or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Furthermore, as used herein, a phrase referring to "at least one of" a list of items refers to any combination of those items, including single members. By way of example, "at least one of: A, B, or C" is intended to cover A, B, C, A-B, A-C, B-C, and A-B-C, as well as multiples of the same members (e.g., any lists that include AA, BB, or CC). Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Various details of the presently disclosed subject matter may be changed without departing from the scope of the presently disclosed subject matter. Furthermore, the foregoing description is for the purpose of illustration only, and not for the purpose of limitation.

What is claimed is:

1. A method for use by a data storage controller, the method comprising:
generating a system clock;
distributing versions of the system clock to a set of processing components of the data storage controller and to sub-components of the processing components;
detecting that all of the sub-components of a particular processing component are in a particular state; and
hierarchically scaling frequencies of the versions of the system clock distributed to the particular processing component and to all of the sub-components of the particular processing component, in response to the detection that all of the sub-components of the particular processing component are in the particular state, wherein the versions of the system clock distributed to the sub-components are scaled by a greater amount as compared to a version of the system clock distributed to the particular processing component;
wherein the generating of the system clock comprises generating first and second asynchronous clocks to form first and second asynchronous clock domains;
wherein the scaling of the frequencies of the versions of the system clock is performed to separately scale the first and second asynchronous clocks; and
wherein the distributing of the versions of the system clock comprises distributing both the first and second asynchronous clocks to at least one sub-component of the particular processing component.

2. The method of claim 1, wherein the particular state is an idle state.

3. The method of claim 2, wherein detecting that all of the sub-components of the particular processing component are in the idle state includes detecting that none of the sub-components of the particular processing component have any active tasks.

4. The method of claim 2, wherein detecting that all of the sub-components of the particular processing component are in the idle state includes:
detecting, on a sub-component by sub-component basis, that any particular sub-component is idle and, in response, notifying the particular processing component; and
determining that all of the sub-components of the particular processing component are idle if all of the sub-components of the particular processing component notify the particular processing component they are idle.

5. The method of claim 1, wherein at least one of the sub-components includes a portion of circuitry that receives an unscaled version of the system clock.

6. The method of claim 1, wherein a particular version of the system clock is scaled by:
applying the particular version of the system clock as an input signal to a clock gating circuit; and
periodically toggling the clock gating circuit to generate an output clock that is a downscaled version of the system clock.

7. The method of claim 1, wherein each of the set of processing components includes at least one clock scaler configured to scale a version of the system clock for output to at least one corresponding sub-component, and wherein hierarchically scaling frequencies of the versions of the system clock comprises scaling the versions of the system clock using respective clock scalers of each of the set of processing components.

8. The method of claim 7, wherein each of the sub-components includes at least one clock scaler configured to scale a version of the system clock received from a corresponding one of the set of processing components for output to a corresponding sub-component of the respective sub-component, and wherein hierarchically scaling frequencies of the versions of the system clock further comprises scaling the versions of the system clock using respective clock scalers of each of the set of sub-components.

9. The method of claim 1, wherein the at least one sub-component comprises a direct memory access (DMA) component, and wherein distributing versions of the system clock comprises distributing both the first and second asynchronous clocks to the DMA component.

10. A data storage controller, comprising:
a set of processing components comprising one or more sub-components;
a system clock generator configured to generate a system clock;

clock distribution circuitry configured to distribute versions of the system clock to the set of processing components and their sub-components;

detection circuitry configured to detect that all of the sub-components of a particular processing component of the set of processing components are in a particular state; and clock scaling circuitry configured to hierarchically scale frequencies of the versions of the system clock distributed to the particular processing component and to all of the sub-components of the particular processing component, the clock scaling circuitry operative in response to a detection that all of the sub-components of the particular processing component are in the particular state, the clock scaling circuitry further configured to scale the versions of the system clock distributed to the sub-components by a greater amount as compared to a version of the system clock distributed to the particular processing component;

wherein the system clock generator is further configured to generate the system clock to include first and second asynchronous clocks that form first and second asynchronous clock domains;

wherein the clock scaling circuitry is further configured to separately scale the first and second asynchronous clocks; and wherein the clock scaling circuitry is further configured to distribute both the first and second asynchronous clocks to at least one sub-component of the particular processing component.

11. The data storage controller of claim 10, wherein the detection circuitry includes idle state detection circuitry and the particular state is the idle state.

12. The data storage controller of claim 10, wherein the clock scaling circuitry includes a clock gater and a controller configured to apply a particular version of the system clock to the clock gater while periodically toggling the clock gater so as to generate an output clock that is a downscaled version of the system clock.

13. The data storage controller of claim 12, wherein the clock scaling circuitry further includes delay circuitry configured to delay the scaling of a particular version of the system clock.

14. The data storage controller of claim 10, wherein the set of processing components and their sub-components form a hierarchy of processing components along with sub-components of at least one of the sub-components.

15. The data storage controller of claim 10, wherein at least one of the processing components or their sub-components includes an always on (AON) circuit.

16. The data storage controller of claim 10, wherein the data storage controller is configured to control a non-volatile memory (NVM) device.

17. The data storage controller of claim 16, wherein the NVM device comprises a NAND storage element.

18. The data storage controller of claim 10, wherein the clock scaling circuitry further includes at least one clock scaler within each of the set of processing components, and wherein each clock scaler is configured to scale a version of the system clock for output to at least one corresponding sub-component.

19. The data storage controller of claim 18, wherein the clock scaling circuitry further includes at least one clock scaler within each of the sub-components, and wherein each of the clock scalers of each of the sub-components is configured to scale a version of the system clock received from a corresponding one of the set of processing components for output to a corresponding sub-component of the sub-component.

20. The data storage controller of claim 10, wherein the at least one sub-component is a direct memory access (DMA) component configured to receive both the first and second asynchronous clocks.

21. An apparatus for use with a data storage system comprising a set of processing components comprising one or more sub-components, the apparatus comprising:

means for distributing versions of a system clock to the set of processing components and their sub-components;

means for detecting that all of the sub-components of a particular processing component are in a particular state; and means for scaling frequencies of the versions of the system clock distributed to the particular processing component and to all of the sub-components of the particular processing component, the means for scaling operative in response to a detection that all of the sub-components of the particular processing component are in the particular state, the means for scaling operative to scale the versions of the system clock distributed to the sub-components by a greater amount as compared to a version of the system clock distributed to the particular processing component;

wherein the means for generating the system clock comprises means for generating first and second asynchronous clocks to form first and second asynchronous clock domains, and wherein the means for scaling the frequencies of the versions of the system clock includes means for separately scaling the first and second asynchronous clocks; and wherein the means for distributing versions of the system clock comprises means for distributing both the first and second asynchronous clocks to at least one sub-component of the particular processing component.

22. The apparatus of claim 21, wherein the means for detecting includes means for detecting that all of the sub-components of the particular processing component are in an idle state when none of the sub-components has any active tasks.

23. The apparatus of claim 21, further comprising means for storing information within a non-volatile memory (NVM) device.

24. The apparatus of claim 21, wherein the at least one sub-component comprises a means for direct memory access (DMA) configured to receive both the first and second asynchronous clocks.

* * * * *